United States Patent [19]

Ortiz, Jr. et al.

[11] Patent Number: 4,927,224
[45] Date of Patent: May 22, 1990

[54] LENSLESS MULTIFIBER OUTPUT COUPLER

[75] Inventors: Angel L. Ortiz, Jr.; Marshall G. Jones, both of Scotia, N.Y.

[73] Assignee: General Electric Company, Schenectady, N.Y.

[21] Appl. No.: 329,137

[22] Filed: Mar. 27, 1989

[51] Int. Cl.$^5$ .............................................. G02B 6/26
[52] U.S. Cl. ................................. 350/96.15; 350/96.2
[58] Field of Search ................ 350/96.1, 96.15, 96.18, 350/96.2, 247

[56] References Cited

U.S. PATENT DOCUMENTS

| | | | |
|---|---|---|---|
| 3,620,603 | 11/1971 | White | 350/247 |
| 4,531,810 | 7/1985 | Carlsen | 350/96.20 |
| 4,707,073 | 11/1987 | Kocher | 350/96.23 |
| 4,718,744 | 1/1988 | Manning | 350/96.18 |
| 4,732,450 | 3/1988 | Lee | 350/96.18 |
| 4,744,627 | 5/1988 | Chande et al. | 350/96.20 |
| 4,753,521 | 6/1988 | Deserno | 350/465 |
| 4,834,488 | 5/1989 | Lee | 350/96.2 |

FOREIGN PATENT DOCUMENTS 58-178312 10/1983 Japan ............................ 350/96.15

Primary Examiner—William L. Sikes
Assistant Examiner—John Ngo
Attorney, Agent, or Firm—John S. Beulick; James C. Davis, Jr.; Paul R. Webb, II

[57] ABSTRACT

An X-shaped body has four slots for receiving optical fibers. A first pair of opposing slots are parallel so the fiber delivered high power laser beams can be used to solder components having leads, while a second pair of slots are at a right angles so the laser beams can be used to solder chip components. Screws and springs are in the slots to adjust the spacing and angle of the fibers of a pair with respect to each other.

11 Claims, 2 Drawing Sheets

LENSLESS MULTIFIBER OUTPUT COUPLER

BACKGROUND OF THE INVENTION

The present invention relates to an output coupler and more particularly, to such a coupler for use in industrial processes, such as soldering.

In a typical industrial process using laser beams, the laser beam is delivered to a workpiece using an optical fiber terminated by an output coupler having at least one focussing lens to achieve the required power density. However, some processes, such as soldering and desoldering the output leads of resistor or capacitor blocks, when performed using a single laser to solder one lead at a time, result in a tilting up of one end of the device away from the circuit board, a process called "tombstoning". This can be prevented on large workpieces by using a plurality of optical fibers and respective output couplers to solder opposing pairs of output leads. However, this cannot be done on small integrated circuits due to the very small spacing between the leads and the large size of the output coupler due to the focussing lens. It is known from U.S. Pat. No. 4,799,755, to have an output coupler for a single optical fiber without any focussing lens at the output of the coupler. However, if the process requires multiple positions and angles with respect to the workpiece, the entire coupler must be moved, which is awkward.

It is therefore an object of the present invention to provide a plurality of laser beams in a small space with the distance between the beams and their angles conveniently adjustable.

SUMMARY OF THE INVENTION

An output coupler for directly applying laser beams from a plurality of optical fibers to a workpiece comprises a body means for receiving the plurality of fibers and for directly applying said laser beams to the workpiece; and means, disposed in said body means, for adjusting the spacing and angle between the fibers.

DETAILED DESCRIPTION

Figure 1:
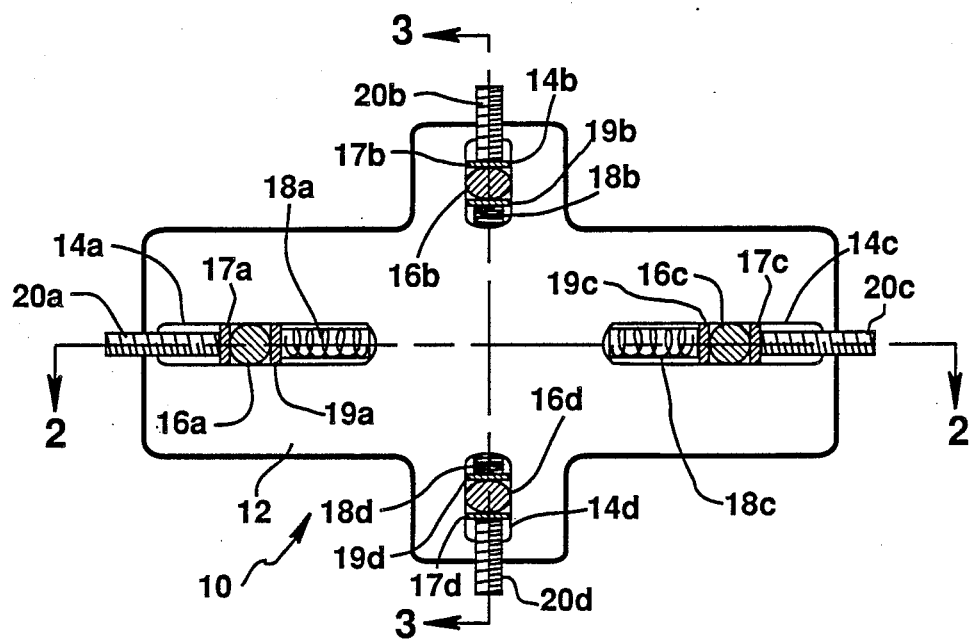
FIG. 1 is a top view of an embodiment of the invention.

As shown in FIG. 1, the coupler of the invention, generally designated by numeral 10, comprises a body 12, such as the synthetic resin material sold under the trademark "Plexiglass." In general, since no lens is used in the present invention, there is no requirement that body 12 be made of any special material that would be dimensionally stable with temperature changes. The body 12 is generally "X"-shaped in cross-section although other shapes can be used. Body 12 has four rectangular slots 14a, 14b, 14c, and 14d disposed in each arm of the "X". Optical fibers 16a, 16b, 16c, and 16d respectively extend through the slots 14a, 14b, 14c, and 14d. The fibers 16 convey high power laser beams, typically between 0.5 to 1.5 kilowatts, from any type of solid state or gas laser, with wavelengths ranging from infrared (2 $\mu$m) to ultraviolet (193 nm). In the slots 14, on one side of fibers 16a, 16b, 16c, and 16d are respectively disposed springs 18a, 18b, 18c, and 18d at a first position, while in slots 14, on an opposing side of the said fibers 16, are respectively disposed opposing threaded fiber adjustment screws 20a, 20b, 20c, and 20d extending to the outside of body 12. Body 12 has threads (not shown) to receive the threads of the screws 20. If desired the screws 20 can be controlled by galvanometers that are part of a servo loop, as known in the art. The screws 20 can be metal, plastic, etc., and the springs 18 can be metal. As known in the art, a pair of buffer plates 17 and 19, such as quartz or plastic, would normally be disposed on either side of each of fibers 16 to prevent damage thereto. The plates 17a, 17b, 17c, and 17d are disposed between each of the fibers 16a, 16b, 16c, and 16d and each of the screws 20a, 20b, 20c, and 20d, respectively. The plates 19a, 19b, 19c, and 19d are disposed between each of the fibers 16a, 16b, 16c, and 16d and each of the springs 18a, 18b, 18c, and 18d, respectively. The remote ends (not shown in FIG. 1) of the fibers 16 preferably are prepared as shown in U.S. Pat. Nos. 4,676,586 and 4,681,396 so as not to be damaged by the injected or emitted laser beam. The remote ends would preferable be injected by laser beam as shown in said U.S. Pat. No. 4,799,755.

Figure 2:
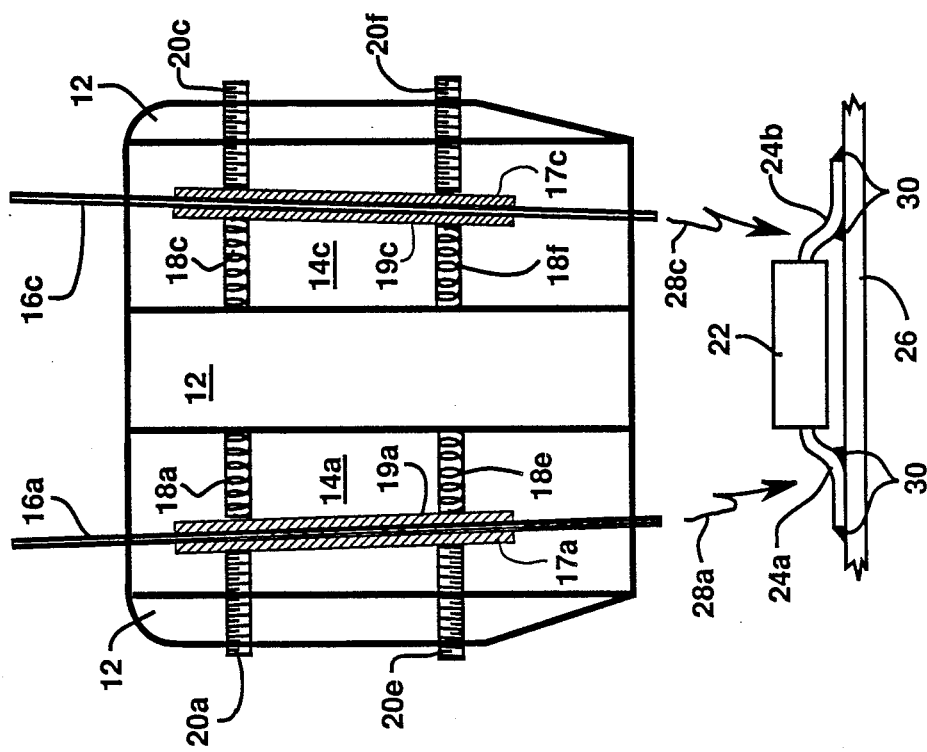
FIG. 2 is a cross-sectional front view taken along line 2-2' of FIG. 1.

As shown in FIG. 2, slots 14a and 14c are parallel with respect to each other. In slot 14a, screw 20e and spring 18e engage the fiber 16a at a second position below the screw 20a and spring 18a, while, similarly, in slot 14c, screw 20f and spring 18f engage the fiber 16c at a second position below screw 20c and spring 18c. Rotation of the screws 20a, 20c, 20e, and 20f is performed in order to control the orientation of fibers 16a and 16c with respect to each other. In particular, the spacing and angle between the fibers 16a and 16c is adjustable, although normally fibers 16a and 16c are substantially parallel, while their spacing is adjusted to accommodate components having different sizes. Fibers 16a and 16c are best suited to perform soldering of gull wing and TAB (tape automated bonding) leads.

Workpiece 22 has gull wing leads 24a and 24b to be soldered to PWB (printed wiring board) 26. This is done by directly applying, i.e., without any intervening wavefront modifying means, such as a diffraction grating or lens, the light beams 28a and 28c from fibers 16a and 16c, respectively, to the leads 24a and 24b, respectively. Although, if desired, a means for preventing back splatter, such as a thin flat piece of glass or plastic, can be interposed between the ends of fibers 16 that are proximate the workpiece and the workpiece itself. Since there is no lens, the fibers 16a and 16c can be close together in order to solder both of the leads 24a and 24b of the same component or workpiece 22 at the same time, thereby preventing "tombstoning". The solder is indicated by numerial 30.

Figure 3:
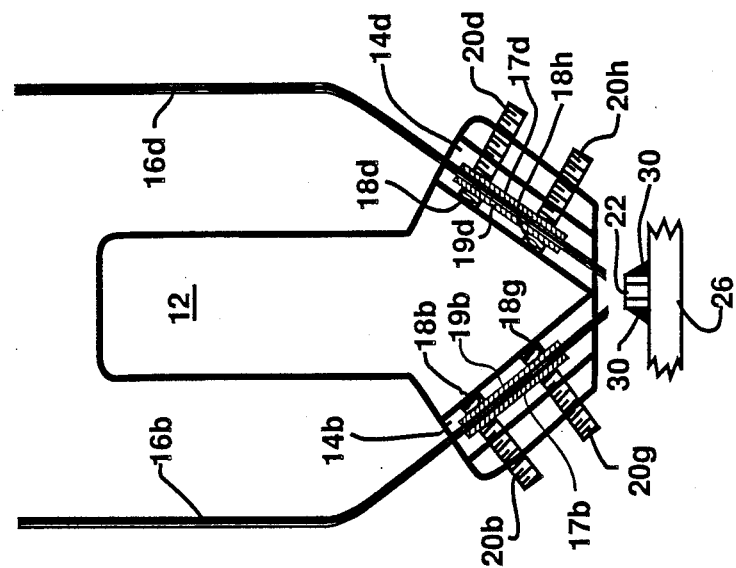
FIG. 3 is a cross-sectional side view taken along line 3-3' of FIG. 1.

In FIG. 3, slots 14b and 14d form a 90 degree angle with respect to each other although other angles can be used. In slot 14b, spring 18g and screw 20g engage fiber 16b at a second position below screw 20b and spring 18b, while in slot 14d, screw 20h and spring 18h engage the fiber 16d at a second position below screw 20d and spring 18d. Adjustment of screws 20b, 20g, 20d, and 20h is performed as described above and typically results in being able to vary the angle between fibers 16b and 16d by about ±10 degrees from a right angle with respect to each other, which is a nominal 45° angle with respect to the horizontal plane. Laser beams from fibers 16b and 16d simultaneously and directly illuminate solder 30 at the ends of a chip component workpiece 22, e.g., carrier, resistor, capacitor, transistor, etc., on PWB board 26 to perform soldering or solder reflow. This can also be used with J-bend components.

It will be appreciated that many other embodiments are possible within the spirit and scope of the invention. For example, a multi-fiber output coupler could also included a fiber arrangement where there are many parallel fibers that are in a line and are adjacent to each other (touching and lined up in a row). For example, the number of fibers would be sufficient to deliver laser energy that would cover all the leads on one side of qull wing quad pack without moving the fibers during the process. The laser energy would be moved along the leads be sequentially switching along the fibers in the row. As in all of these approaches, a beam splitting and switching means, such as shown in application Ser. No. 07/329,160, filed Mar. 27, 1989, and entitled "Multiplexer For High Powered CW Lasers," filed in the name of the present inventor, would be required. This invention could also be used to address some of the needs of reworking and repairing PWBs. Passive chip components could be desoldered with the simultaneous dual fiber optic laser beam delivery approach, of the present invention. Once removed, new chip components could readily be replaced.

What is claimed is:

1. A output coupler for directly applying laser beams from a plurality of optical fibers to a workpiece, said coupler comprising:

a body means for receiving a plurality of fiber and for directly applying said laser beams to the workpiece; and means, disposed in said body means, for adjusting the spacing and angle between the fibers, said adjusting means comprising a first screw disposed to engage a first fiber at a first position, and a first spring having first and second ends, said first spring end disposed to engaged said first fiber opposite said first screw and said second spring end disposed to engage said body means.

2. The coupler of claim 1 wherein said body means has a plurality of slots for respectively receiving said fibers.

3. The coupler of claim 2 wherein said slots are parallel with respect to each other.

4. The coupler of claim 2 wherein said slots are at an angle of about 90 degrees with respect to each other.

5. The coupler of claim 1 wherein said body means has a generally X-shaped cross-section.

6. The coupler of claim 1 wherein said adjusting means further comprises a second screw disposed to engage said first fiber at a second position and a second spring disposed to engage said first fiber opposite said second screw.

7. The coupler of claim 1 further comprising buffer plates disposed between said adjustment means and said fibers.

8. An output coupler for directly applying laser beams from a plurality of optical fibers to a workpiece, said coupler comprising:

a body having a plurality of slots for respectively receiving the fibers and for directly applying the laser beams to the workpiece, said slots comprising a first and second pair of opposing slots, said first pair being substantial parallel with respect to each other, said second pair being substantially at 90 degrees with respect to each other;

and means, disposed in each of said slots, for adjusting the spacing and angle of the fibers of a pair with respect to each other.

9. The coupler of claim 8 wherein said body comprises a plurality of arms in a generally X-shaped configuration, said slots being respectively disposed in said arms.

10. The coupler of claim 8 wherein said adjusting means comprises at least a first screw and a first spring disposed in each of said slots to engage opposing sides of the respective fibers at a first position.

11. The coupler of claim 10 wherein said adjusting means further comprises a second screw and a second spring disposed in each of said slots to engage opposing sides of the fibers at a second position.

* * * * *